United States Patent [19]

Tsutsumi

[11] Patent Number: 6,018,181
[45] Date of Patent: Jan. 25, 2000

[54] THIN FILM TRANSISTOR AND MANUFACTURING METHOD THEREOF

[75] Inventor: Kazuhito Tsutsumi, Hyogo-ken, Japan

[73] Assignee: Mitsubishi Denki Kabushiki Kaisha, Tokyo, Japan

[21] Appl. No.: 08/358,050

[22] Filed: Dec. 16, 1994

Related U.S. Application Data

[63] Continuation of application No. 08/026,111, Mar. 1, 1993, abandoned, which is a continuation-in-part of application No. 07/774,103, Oct. 11, 1991, abandoned.

[30] Foreign Application Priority Data

Oct. 12, 1990 [JP] Japan .................................... 2-274360
Aug. 30, 1991 [JP] Japan .................................... 3-220277

[51] Int. Cl.[7] .............................. H01L 27/01; H01L 27/12
[52] U.S. Cl. ................................. 257/347; 257/60; 257/66
[58] Field of Search ......................... 357/23.7, 4; 257/60, 257/66, 347

[56] References Cited

U.S. PATENT DOCUMENTS

| 4,654,121 | 3/1987 | Miller et al. ............................ 156/653 |
| 4,704,623 | 11/1987 | Piper et al. ............................... 257/60 |
| 5,198,379 | 3/1993 | Adam ........................................ 257/60 |
| 5,266,507 | 11/1993 | Wu ............................................ 257/66 |

FOREIGN PATENT DOCUMENTS

| 0102802 | 8/1983 | European Pat. Off. ............... 357/23.7 |
| 2535528 | 10/1982 | France . | |
| 57-60868 | 9/1980 | Japan .................................... 357/23.7 |
| 58-153371 | 9/1983 | Japan .................................... 357/23.7 |
| 61-225869 | 3/1985 | Japan .................................... 357/23.7 |
| 63-120455 | 11/1986 | Japan .................................... 357/23.7 |
| 63-168034 | 12/1986 | Japan .................................... 357/23.7 |
| 62-011274 | 1/1987 | Japan .................................... 357/23.7 |
| 62-048045 | 7/1987 | Japan .................................... 357/23.7 |
| 1-229229 | 3/1988 | Japan .................................... 357/23.7 |
| 63-502633 | 9/1988 | Japan .................................... 357/23.7 |
| 1170048 | 7/1989 | Japan .................................... 357/23.7 |
| 2143462 | 6/1990 | Japan .................................... 357/23.7 |

OTHER PUBLICATIONS

S.M. Sze, *VLSI Technology*, Second Edition, pp. 250–259.

Yamanaka et al., "A $25\mu m^2$, New Poly–Si PMOS Load (PPL) SRAM Cell Having Excellent Soft Error Immunity" IEEE IEDM 88 (1988), pp. 48–51.

Ueda et al "A 5 nm Thick Ultra–Thin Double–Gated Poly Si TFT Using Si2H6", Japanese Journal of Applied Physics Extended Abstracts, 22nd Conf. Solid State Devices and Materials (1990), Tokyo Japan.

Bahl et al "c–Band 10 watt MMIC Amplifier Manufactured Using Refractory SAG Processes", IEEE Jun. 1989 Microwave and Millimeter–Wave Monolithic Circuits Symposium Digest of Papers, Jun. 1989) pp. 21–24.

*Primary Examiner*—Stephen D. Meier
*Attorney, Agent, or Firm*—McDermott, Will & Emery

[57] ABSTRACT

A thin film transistor has a gate electrode formed of polysilicon on a surface of an insulating substrate or an insulating layer. The surface of the gate electrode is covered with a dielectric layer. A polysilicon layer is formed on a surface of the dielectric layer and source/drain regions are formed in this polysilicon layer. The dielectric layer covers the surface of the gate electrode and has its surface made flat. The source/drain regions are formed in the polysilicon layer on the surface of this flat dielectric layer. In another embodiment, a dielectric layer has a 2-layered structure with sidewall insulating layers located on sidewalls of a gate electrode and another insulating layer covering a surface of the gate electrode and surfaces of the sidewall insulating layers. By having larger film thickness of the dielectric layer in the vicinity of a side portion of the gate electrode than that above the gate electrode, the electric field concentration is modified in the vicinity thereof.

15 Claims, 16 Drawing Sheets

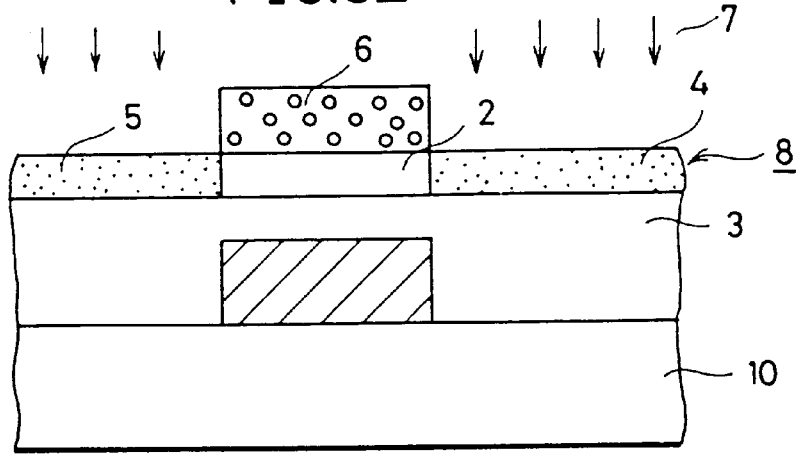
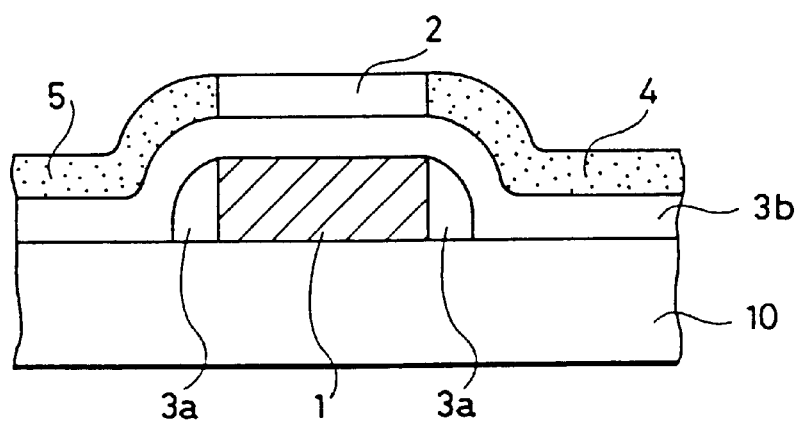
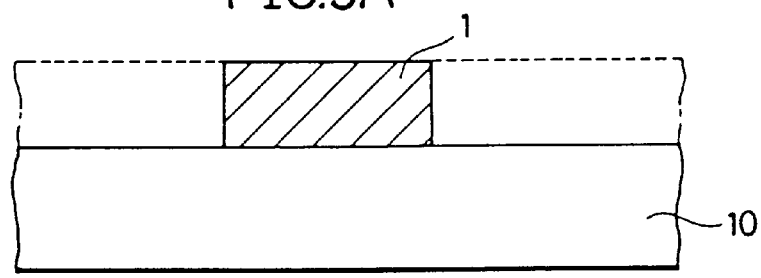

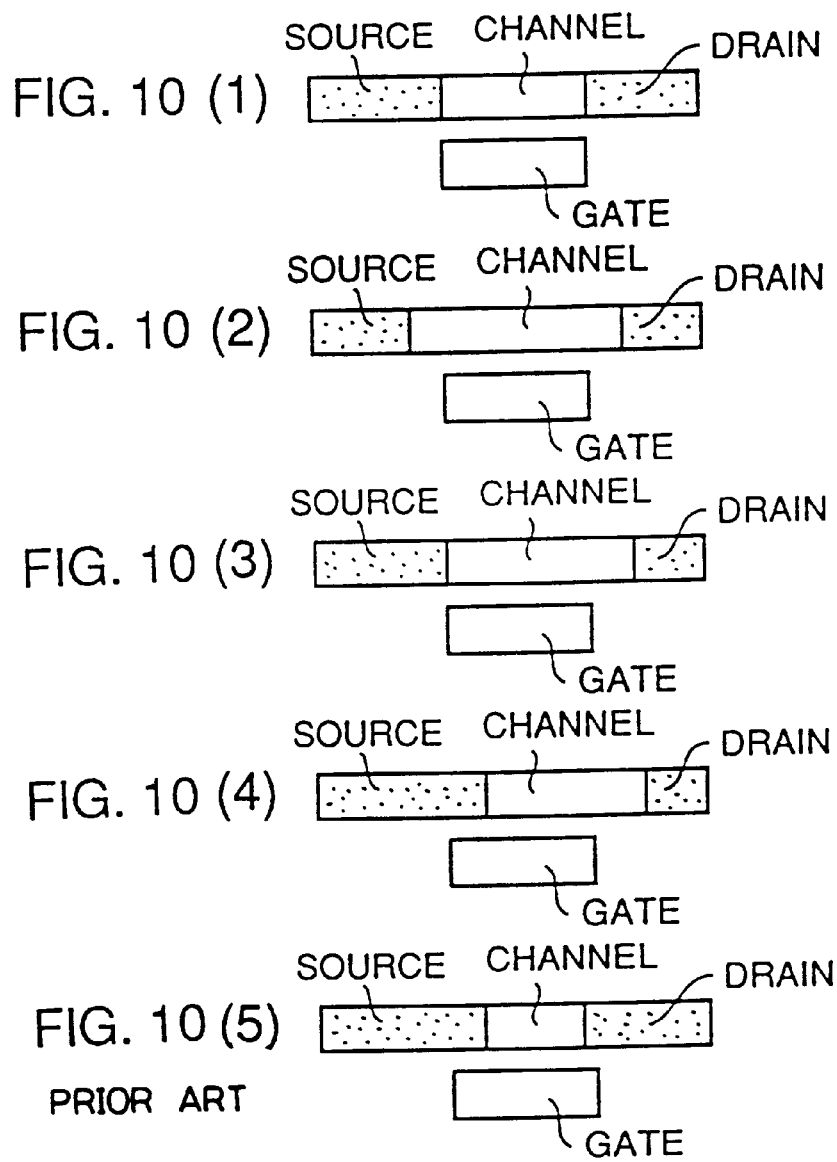
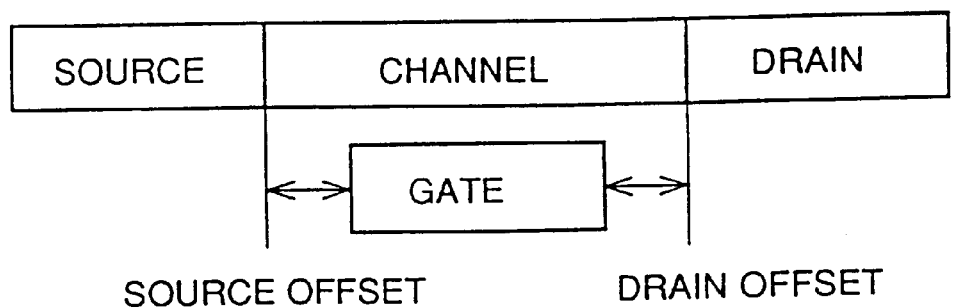

THIN FILM TRANSISTOR AND MANUFACTURING METHOD THEREOF

This application is a continuation of application Ser. No. 08/026,111 filed Mar. 1, 1993, now abandoned, which is a continuation-in part of Application Ser. No. 07/774,103 filed Oct. 11, 1991, now abandoned.

BACKGROUND OF THE INVENTION

1. Field of the Invention

The present invention relates to thin film transistors with increased gate dielectric breakdown voltage, and to a manufacturing method of the thin film transistors.

2. Description of the Background Art

Insulated gate field effect transistors configured by forming a semiconductor thin film on an insulating substrate and providing a channel region in this film includes a so-called thin film transistor.

FIG. 7 is a diagram showing a sectional structure of a conventional thin film transistor. This thin film transistor is disclosed in International Electron Device Meeting 1988, for example. Referring to FIG. 7, in a conventional thin film transistor, a gate electrode 1 formed of polysilicon is formed on a surface of an insulating substrate or insulating layer 10. Furthermore, a dielectric layer 3 formed of an oxide film with a film thickness t of about 250 Å, for example, is formed on the surfaces of insulating substrate 10 and gate electrode 1. Furthermore, a polysilicon layer with a film thickness of about 200 Å is formed on the surface of dielectric layer 3. Conductive regions 4 and 5 to be a pair of source/drain regions are formed in polysilicon layer 8, wherein a region located between the conductive regions 4 and 5 configures a channel region 2.

Next, the process for manufacturing such a thin film transistor as described above will be described. FIGS. 8A through 8D are manufacturing process sectional diagrams of the thin film transistor shown in FIG. 7.

First, as shown in FIG. 8A, after forming a polysilicon layer on the surface of insulating substrate 10, it is patterned to be a predetermined shape employing the photolithography method and the etching method. Gate electrode 1 is formed in this process.

Next, as shown in FIG. 8B, applying the low pressure CVD (Chemical Vapor Deposition) method all over the surface, an oxide film is deposited to a film thickness of about 250 Å, for example. The oxide film serves as dielectric layer 3.

Furthermore, as shown in FIG. 8C, a polysilicon layer 8 is formed on the surface of dielectric layer 3 to a film thickness of about 200 Å using the low pressure CVD method. Then, using the photography method and the etching method, polysilicon layer 8 is patterned into a predetermined shape.

Subsequently, as shown in FIG. 8D, a resist pattern 6 is formed at a predetermined position on the surface of polysilicon layer 8. Then, using the resist pattern 6 as a mask, p-type impurity, e.g., $BF_2$ ions 7 are implanted into polysilicon layer 8 to form p-type conductive regions 4 and 5 in polysilicon layer 8.

By the above-described process, the thin film transistor shown in FIG. 7 is formed.

A thin film transistor manufactured by the above manufacturing method has a problem that the film thickness of dielectric film 3 is uneven especially above a corner of gate electrode 1, so that a strong electric field is produced in this region in a predetermined operation. That is, in dielectric film 3 formed by the CVD method, the film thickness is decreased at the corner of gate electrode 1 as compared to other portions. Accordingly, in the vicinity of this region, an effective film thickness necessary for securing a predetermined dielectric breakdown voltage decreases.

FIG. 9 is an electric field distribution diagram showing electric field distribution in the vicinity of a corner of gate electrode. In the condition shown in the figure, −5 V is applied to gate electrode 1, 0 V is applied to a source region, and −5 V is applied to the drain region. In this simulation, a dielectric film 3 is modeled in a shape having a uniform film thickness and having a corner corresponding to a corner of gate electrode 1. As shown in FIG. 9, it is known that the gradient of the equal electric field curves 11 become sharp in a corner of dielectric layer 3 located above a corner of gate electrode 1 to produce electric field concentration. Such a strong electric field region causes leakage from gate electrode 1 to source/drain regions 4 and 5 to decrease the driving current of the thin film transistor. Also, in some cases, the strong electric field concentration produces dielectric breakdown of the dielectric film.

SUMMARY OF THE INVENTION

It is an object of the present invention to provide a thin film transistor having gate structure capable of moderating electric field concentration inside a dielectric layer.

It is another object of the present invention to provide a method for manufacturing a thin film transistor having a large gate dielectric breakdown voltage.

A thin film transistor in accordance with the present invention includes a gate electrode formed on an insulating layer, and a dielectric layer is formed on the upper surface and the side surface of this gate electrode. The dielectric layer is formed having a smooth flat surface. Furthermore, a semiconductor layer is formed on the surface of the dielectric layer. In the semiconductor layer, a channel region is formed in a region located above the gate electrode, and a pair of conductive regions are formed in regions located on both sides of this channel region.

Furthermore, in another aspect of the present invention, a thin film transistor has its gate electrode formed on a first insulating layer. A dielectric layer formed on the surface of the gate electrode is in contact with side surfaces of the gate electrode and formed of a second insulating layer formed only on the first insulating layer in the vicinity of the gate electrode and a third insulating layer formed on the upper surfaces of the first insulating layer, the second insulating layer and the gate electrode. A semiconductor layer is formed on the surface of the dielectric layer, which has a channel region in a region located above the gate electrode and a pair of conductive regions in regions located on both sides of the channel region.

Forming a dielectric layer having its film thickness thicker in a portion in contact with an angular portion and a sidewall portion of a gate electrode moderates the electric field concentration in the region in the vicinity of the angular portion of the gate electrode to prevent the degradation of a dielectric breakdown voltage, and the dielectric breakdown.

Furthermore, in still another aspect of the present invention, a method of manufacturing thin film transistors includes the following steps.

First, a gate electrode is formed on a surface of an insulating layer. Next, a dielectric layer is formed covering the upper surface and the side surfaces of the gate electrode and having a flat surface. Furthermore, a semiconductor layer is formed on the surface of the dielectric layer. Then, a mask layer with a predetermined shape is formed on the surface of the semiconductor layer. Impurity is implanted into the polysilicon layer using the mask layer to form a pair of impurity regions.

In yet another aspect of the present invention, a method of manufacturing thin film transistors includes the following steps.

First, a gate electrode is formed on a surface of a first insulating layer. Next, a second insulating layer is formed on the surfaces of the first insulating layer and the gate electrode. Then, the second insulating layer is anisotropically etched to form sidewall insulating films composed of the second insulating layer on the sidewalls of the gate electrode. Furthermore, a third insulating layer is formed on the surfaces of the first insulating layer, the sidewall insulating films and the gate electrode. A semiconductor layer is then formed on the surface of the third insulating layer. Subsequently, a mask layer with a predetermined shape is formed on the surface of the semiconductor layer, and impurity is implanted into the semiconductor layer using this mask layer to form a pair of impurity regions.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A, 3B, 3C, 3D and 3E are sectional diagrams showing another process of manufacturing a thin film transistor shown in FIG. 1.

FIG. 4 is a sectional structural view of the thin film transistor in accordance with another embodiment of the present invention.

FIGS. 5A, 5B, 5C, 5D and 5E are sectional diagrams showing a process of manufacturing the thin film transistor shown in FIG. 4.

FIGS. 10(1) to 10(4) are diagrams showing the relationship between the gate electrode, and the interfaces between the channel region and the source/drain regions for different basic structures of thin film transistor, with FIG. 10(1) showing the relationship for the embodiment of FIG. 1.

FIG. 10(5) is a diagram showing the relationship between the gate electrode, and the interfaces between the channel region and the source/drain regions for a Prior Art basic structure thin film transistor.

FIG. 10(6) is a diagram showing the position of the source/drain regions relative to the gate electrodes for a thin film transistor having the basic structure of FIG. 10(2).

DESCRIPTION OF THE PREFERRED EMBODIMENTS

Figure 1:
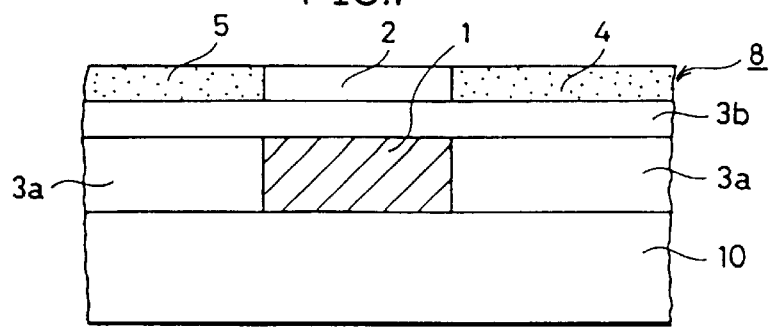
FIG. 1 is a sectional structure diagram of a thin film transistor in accordance with the embodiment of FIG. 1 of the present invention.

Referring to FIG. 1, a thin film transistor in accordance with the first embodiment of the present invention is formed on a surface of an insulating layer 10 formed on an insulating substrate or a silicon substrate, for example. That is, a gate electrode 1 formed of polysilicon having a substantially rectangular section is formed on the surface of insulating layer 10. Impurity for giving conductivity is introduced into gate electrode 1. First dielectric layers 3a having film thickness almost same as that of gate electrode 1 are formed on both sides of gate electrode 1. This first dielectric layer 3a is formed of a TEOS (Tetra Ethyl Ortho Silicate), for example. A second dielectric layer 3b formed of a silicon oxide film, silicon nitride film or the like is formed on the surfaces of the gate electrode 1 and the first dielectric layers 3a. The surface of the second dielectric layer 3b is formed almost flat. Furthermore, a polysilicon layer 8 is formed on the surface of second dielectric layer 3b. Polysilicon layer 8 has a channel region 2 at a region located above the gate electrode, and conductive regions 4 and 5 to serve as source/drain regions are formed on both sides of this channel region 2. The boundary of source/drain regions 4, 5 and channel region 2 may be located above gate electrode 1, and also may be separated from an edge surface of gate electrode 1.

In such a transistor structure as shown in FIG. 1, second dielectric layer 3b provided between gate electrode 1 and channel region 2 is formed having a predetermined film thickness, which is about 250 Å, for example. First dielectric layer 3a and second dielectric layer 3b are interposed between gate electrode 1 and conductive regions 4, 5. FIG.

Figure 9:
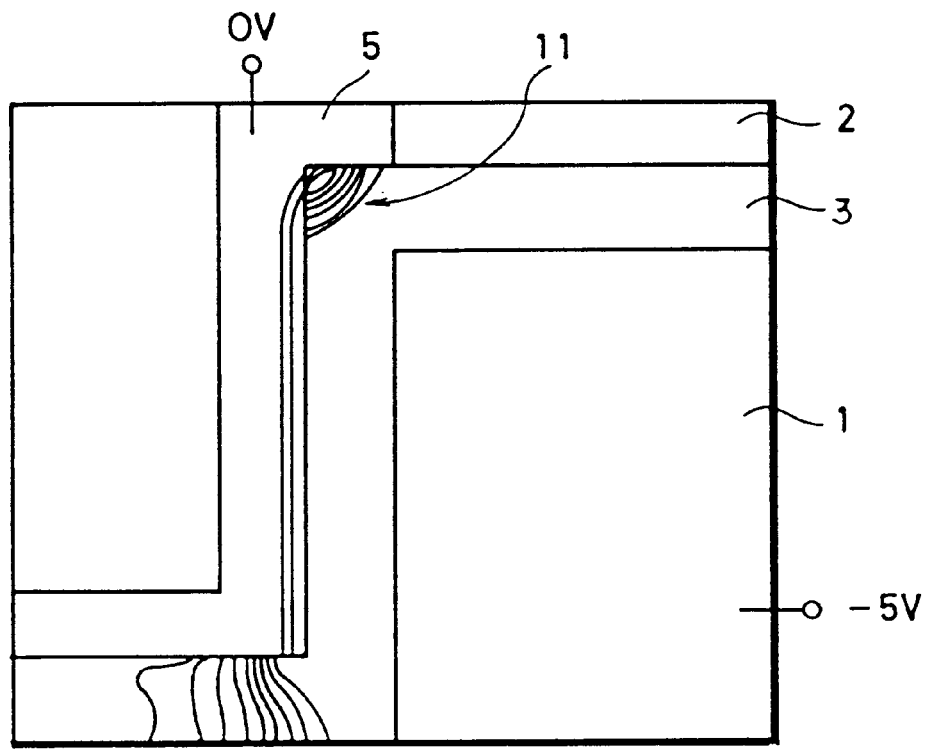
FIG. 9 is an electric field strength distribution diagram showing the electric field strength distribution of a conventional thin film transistor.
Figure 8A:
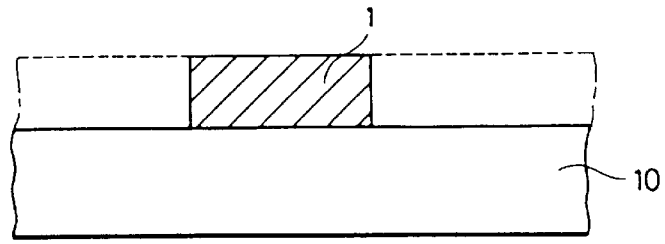
FIGS. 8A, 8B, 8C and 8D are sectional diagrams showing a process for manufacturing the conventional thin film transistor shown in FIG. 7.
Figure 8B:
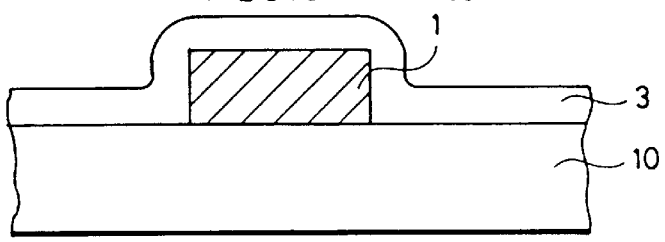
Figure 8C:
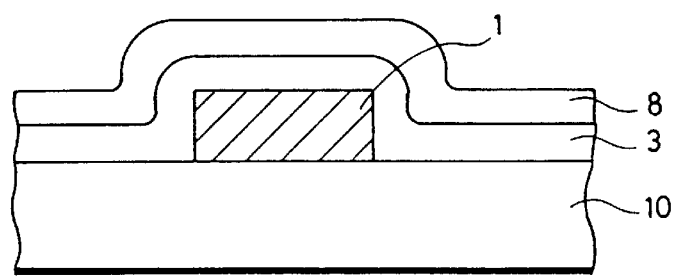
Figure 8D:
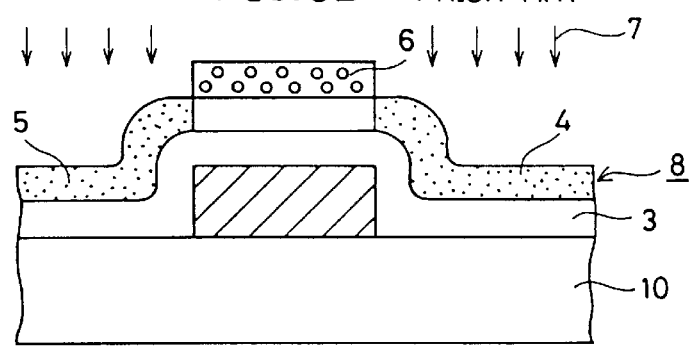

6 is an electric field strength distribution diagram in operation of the thin film transistor shown in FIG. 1. The operational conditions are same as those of FIG. 9 shown in the conventional thin film transistor. That is, −5 V is applied to gate electrode 1, 0 V is applied to source region 5, and −5 V is applied to the drain region. As seen from the figure, in the electric field in dielectric layers 3a, 3b in the vicinity of a corner and a sidewall of gate electrode 1, the gradient of the equal electric field curves 11 is more moderate as compared to the conventional one shown in FIG. 9 to lighten the electric field concentration.

In the thin film transistor shown in FIG. 1, the interfaces between the channel region and the source/drain regions substantially coincide with opposing ends of the gate electrode as better seen in FIG. 10(1).

Thin film transistors are disclosed by Hidenobu Ishikura in Japanese Patent 58-153371 (FIG. 4), and by Michael Poleshuk in European Patent 0 102 802 A1 (FIG. 10). However, in both of these transistors, the interfaces between the channel region and the source/drain regions are positioned inside opposing ends of the gate electrode. FIG. 10(5) shows a thin film transistor having such basic structure. More specifically, the interfaces are on the gate electrode.

FIG. 10(2) shows another basic structure of the thin film transistor of the invention in which the interfaces between the channel region and the source/drain regions are positioned outside opposing ends of the gate electrode.

FIG. 10(3) shows a further basic structure of the thin film transistor of the invention in which the interface between the channel region and the source region substantially coincides with an end of the gate electrode on its source side. The interface between the channel region and the drain region is positioned outside an end of the gate electrode on its drain side.

FIG. 10(4) shows still another basic structure of the thin film transistor of the invention in which the interface between the channel region and the source region is positioned inside an end of the gate electrode on its source side, that is, the interface is on the gate electrode. The interface between the channel region and the drain region is positioned outside an end of the gate electrode on its drain side.

In a thin film transistor having the basic structures shown in FIGS. 10(1) and 10(2), the electric field concentration is moderated in the vicinity of the side portions and angular portions (on both source and drain sides) of the gate electrode to increase the life time of the transistor. In a thin film transistor having the basic structures shown in FIGS. 10(3) and 10(4), the electric field concentration is moderated in the vicinity of side portions and angular portions (particularly on the drain side) of the gate electrode. In addition, the leakage (drain) current in the nonoperating state (OFF current) can be made smaller without substantially decreasing the drain current in the operating state.

Figure 13:
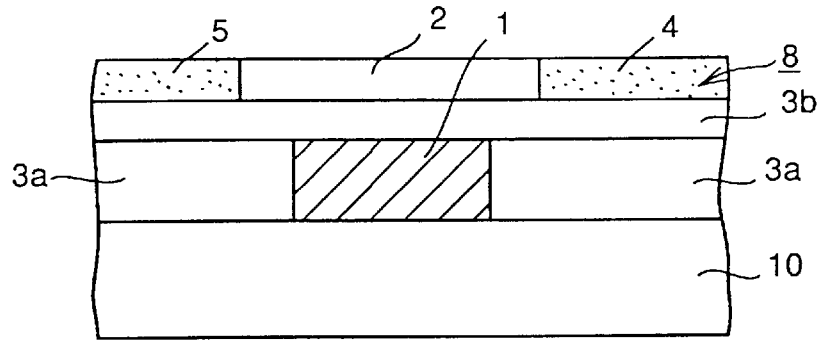
FIGS. 13, 16 and 19 are sectional structure diagrams of thin film transistors having the basic structures of FIGS. 10(2), 10(3) and 10(4), respectively.
Figure 16:
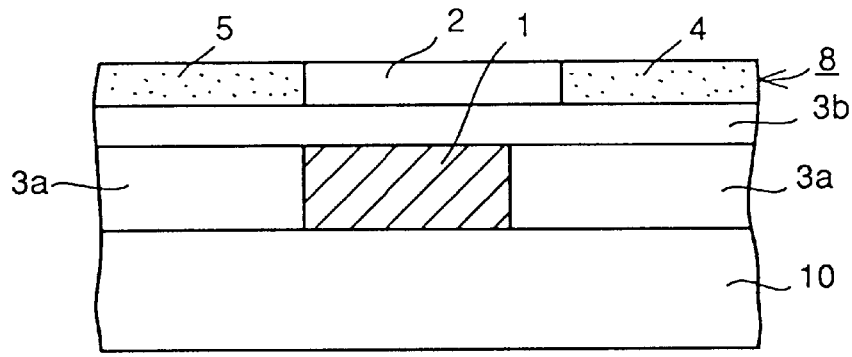
Figure 19:
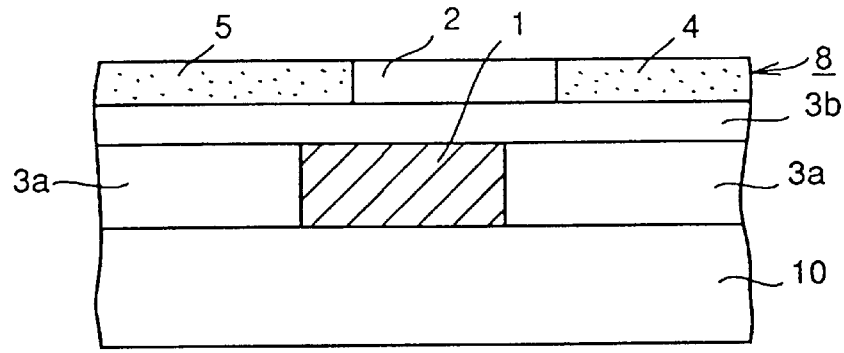

FIGS. 13, 16 and 19 show sectional structures of the thin film transistors having the basic structures shown in FIGS. 10(2), 10(3) and 10(4), respectively. The sectional structures are similar to the sectional structure shown in FIG. 1 for the thin film transistor with the basic structure shown in FIG. 10(1) with corresponding portions having the same identification. The difference in each sectional structure is the position of the interfaces between the channel region and the source/drain regions with respect the gate electrode 1.

FIG. 10(6) shows the position of source/drain regions relative to the gate electrode in a TFT (Thin Film Transistor). A value of "Drain Offset" is positive if the interface between the channel region and the drain region is positioned outside an end of the gate electrode on its drain side. A value of "Source Offset" is positive if the interface between the channel region and the source region is positioned outside an end of the gate electrode on its source side.

Figure 11:
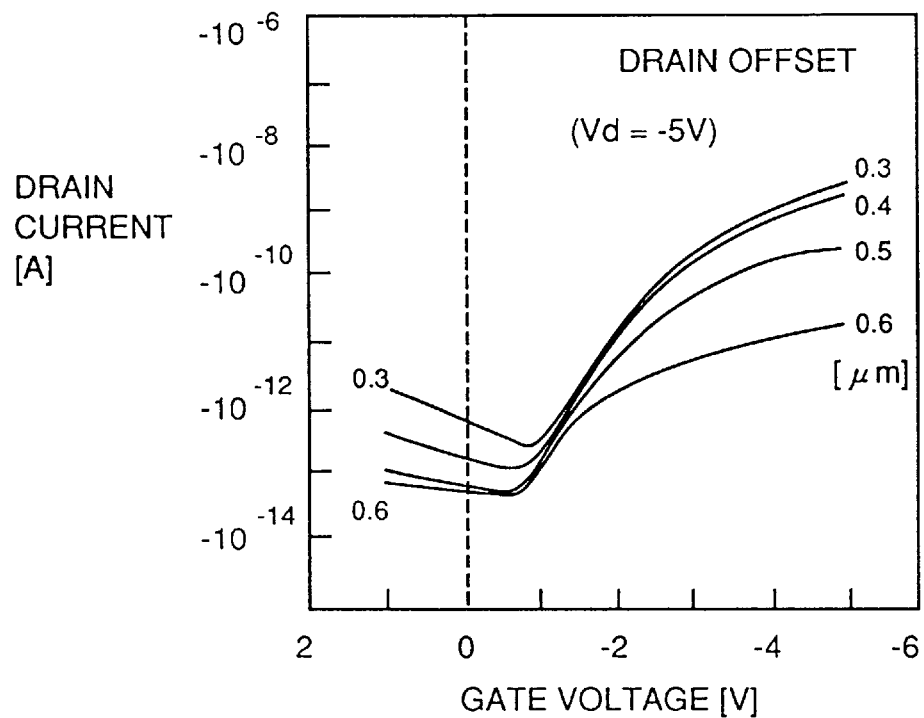
FIG. 11 is a graph showing the relationship between the gate voltage and the drain current of a p-channel thin film transistor (TFT) for different drain offsets.

FIG. 11 is a graph showing the relation between the gate voltage and the drain current of a p-channel TFT in case of changing drain offset shown in FIG. 10. The drain voltage (Vd) of the p-channel TFT is −5 V. If the drain offset increases to 0.6 µm under the above condition, OFF current (the leakage current in the nonoperating state), i.e. the drain current in the case where the gate voltage is 0 V or more becomes smaller, since the distance between the drain and the gate becomes larger and the electric field between the drain and the gate is mitigated. However, ON current (the drain current in the operating state, for example, in the case where the gate voltage is −5 V) also becomes smaller if the drain offset increases to 0.6 µm under the above condition. In consideration of applying the p-channel TFT to a load transistor of a SRAM (Static Random Access Memory) cell, it is necessary to make the OFF current smaller and make the ON current larger. Thus, an appropriate value for drain offset should be 0.4~0.5 µm so as to provide a smaller OFF current without substantially decreasing an ON current. In view of misalignment of mask used in forming the drain region, an actual value for drain offset could be 0.4~0.7 µm.

Figure 12:
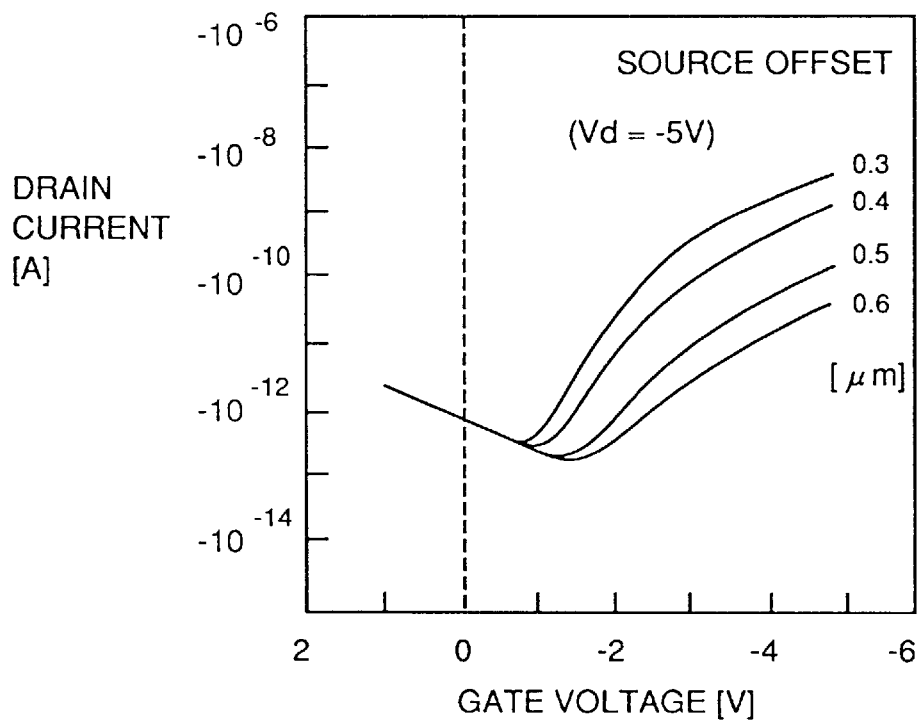
FIG. 12 is a graph showing the relationship between the gate voltage and the drain current of a p-channel thin film transistor for different source offsets.

FIG. 12 is a graph showing the relation between the gate voltage and the drain current of a p-channel TFT in case of changing source offset shown in FIG. 10. The drain voltage (Vd) of the p-channel TFT is −5 V. If the source offset increases to 0.6 µm under the above condition, OFF current does not change and ON current becomes smaller. In case of applying the p-channel TFT to a load transistor in a SRAM cell, an appropriate value for source offset should be 0 µm so as to hold a larger ON current. In the same way as described above, an actual value for source offset would be 0~0.2 µm in view of misalignment of the mask used in forming the source region. In other words, the interface between the channel region and the source region substantially coincides with an end of the gate electrode on its source side or is positioned on the gate electrode.

As described above, in order to improve the properties of TFT as well as to moderate the electric field concentration on drain side of the gate electrode, the basic structure of the TFT show in FIG. 10(3) or FIG. 10(4) is preferable.

Next, a process of manufacturing the thin film transistor shown in FIG. 1 will be described.

Figure 2A:
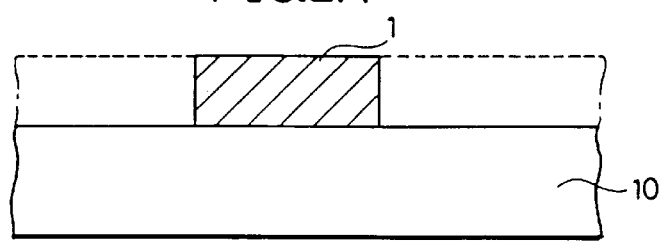
FIGS. 2A, 2B, 2C, 2D, 2E and 2F are sectional diagrams showing steps of manufacturing a thin film transistor shown in FIG. 1.

First, as shown in FIG. 2A, a polysilicon layer is deposited to a film thickness of about 1500 Å employing the low pressure CVD method on a surface of an insulating layer 10. Impurity ions are then implanted into the polysilicon to give it conductivity. Subsequently, it is patterned into a predetermined shape using the photolithography method and the etching method to form a gate electrode 1.

Figure 2B:
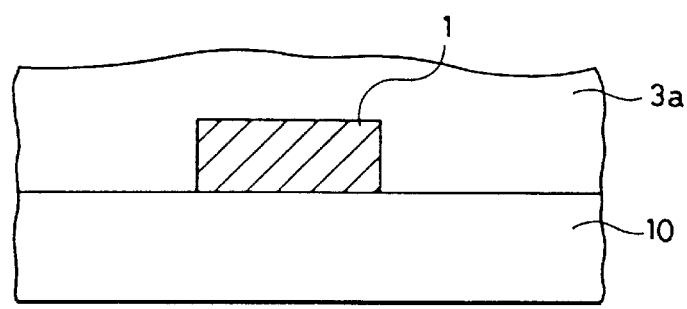

Next, as shown in FIG. 2B, a TEOS film 3a is deposited to a film thickness of about 10000 Å using the low pressure CVD method. The TEOS film shows the flow property when being formed, so that undulation of the foundation such as insulating layer 10 is reduced while the TEOS film is growing, resulting in forming a flat surface of the TEOS film. Such property of a TEOS film is described in "VLSI TECHNOLOGY" Second Edition, by S. M. Sze. McGrow-Hill Book Company, p.p. 235–258, for example.

Figure 2C:
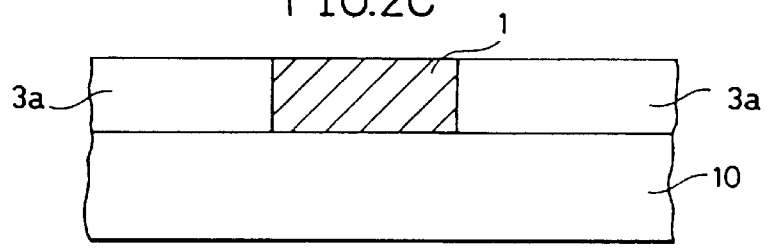

Furthermore, as shown in FIG. 2C, TEOS film 3a is etched back using dry etching such as a reactive ion etching (RIE) to expose the surface of gate electrode 1. By this process, the surfaces of gate electrode 1 and first dielectric layers 3a are formed flat.

Figure 2D:
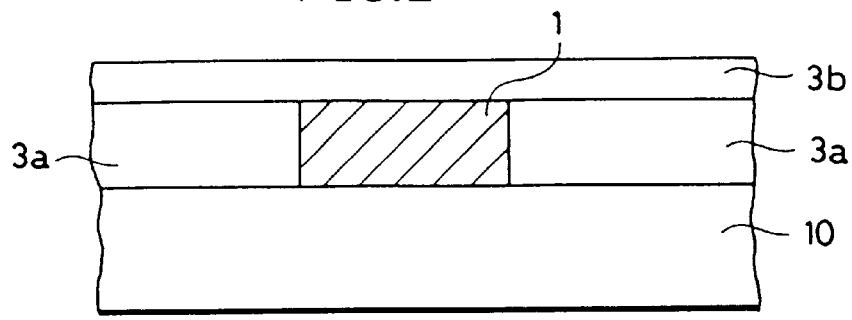

Furthermore, as shown in FIG. 2D, a silicon oxide film (second dielectric layer) 3b is deposited to a film thickness of about 250 Å using the low pressure CVD method on the surfaces of gate electrode 1 and first dielectric layers 3a, 3a.

Figure 2E:
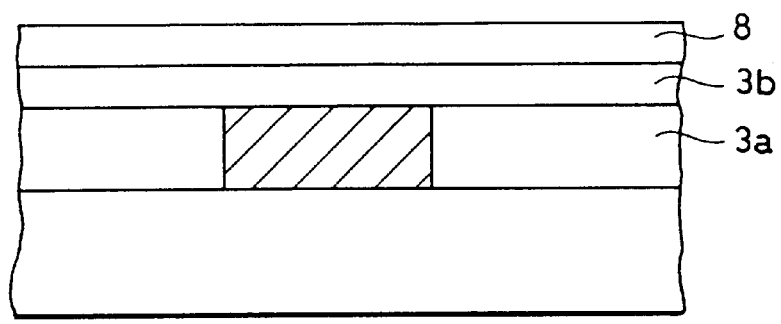

Furthermore, as shown in FIG. 2E, a polysilicon layer 8 is deposited to a film thickness of about 200 Å using the low pressure CVD method on the surface of second dielectric layer 3b.

Figure 2F:
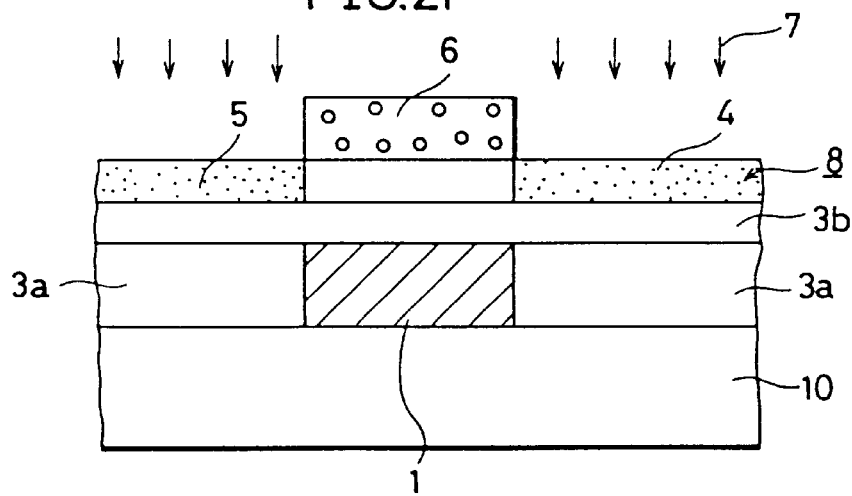

Subsequently, as shown in FIG. 2F, a resist 6 is formed using the photolithography method on the surface of polysilicon layer 8 located above gate electrode 1. Then, using resist 6 as a mask, p type impurity ions, e.g., $BF_2$ ions 7 are implanted to a dose of about $10^{15}/cm^2$ into polysilicon layer 8. By this, conductive regions 4, 5 to be source/drain regions are formed in polysilicon layer 8.

Figure 14:
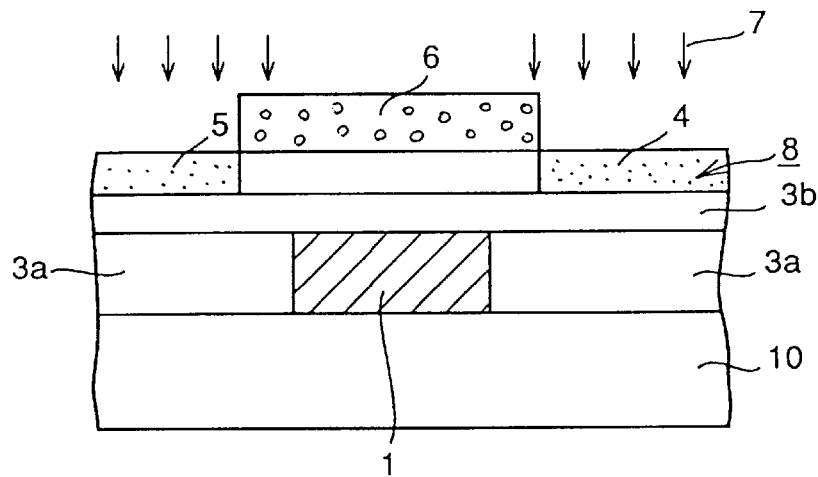
FIGS. 14, 17 and 20 are sectional diagrams showing a phase of manufacturing the thin film transistors shown in FIGS. 13, 16 and 19, respectively, with the steps of manufacturing shown in FIGS. 2A–2F and at the phase corresponding to FIG. 2F.
Figure 17:
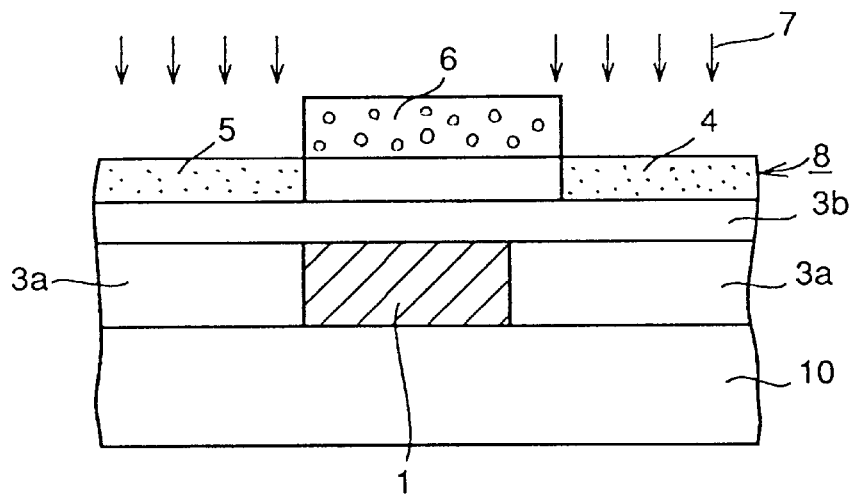
Figure 20:
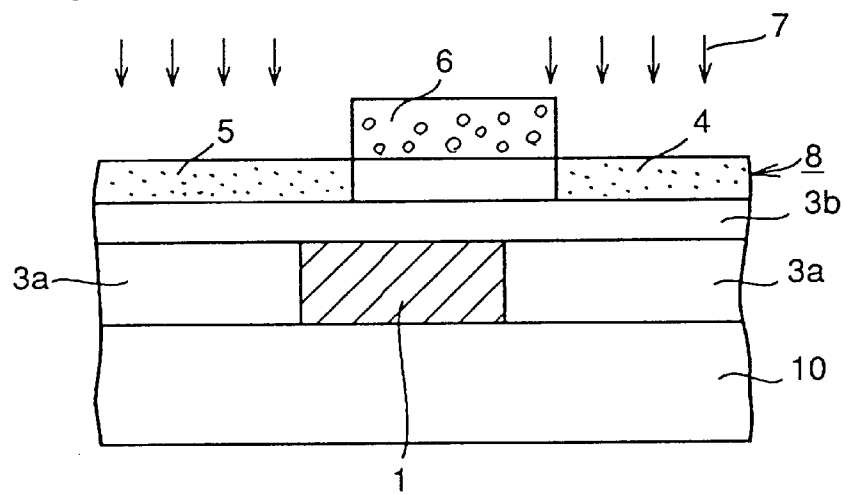

The process of manufacturing the thin film transistor shown in FIG. 1 and described with respect to FIGS. 2A to 2E can also be used to manufacture thin film transistors having the basic structures shown in FIGS. 10(2), 10(3) and 10(4), respectively. FIGS. 14, 17 and 20, show sectional structures of thin film transistors having such basic structures and correspond to the phase of manufacture shown in FIG. 2F with corresponding portions having the same identification.

In the above process of manufacturing, the dry etching method is employed in etching back of first dielectric layer (TEOS film) 3a, but a wet etching method can be employed.

Figure 3A:
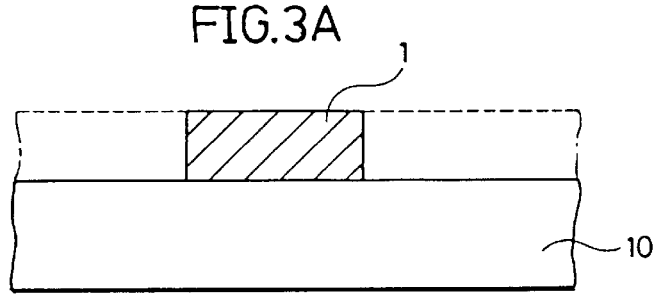
Figure 3B:
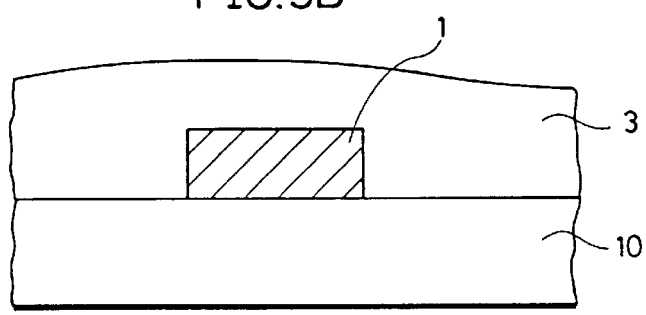
Figure 3C:
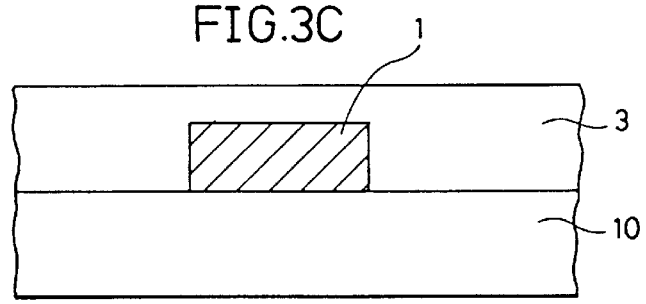

Next, another method of manufacturing a thin film transistor will be described. This method of manufacturing is a modification of the method of manufacturing the thin film transistor shown in FIG. 1. FIGS. 3A through 3E are sectional diagrams showing steps for manufacturing the thin film transistor shown in FIG. 1. The steps of FIGS. 3A and 3B are the same as those shown in FIGS. 2A and 2B of the first embodiment, so that description thereof is not repeated. Next, as shown in FIG. 3C, a TEOS film 3 formed thick on the insulating layer is etched back, in which the etching is finished halfway so that the TEOS film with a predetermined thickness is left on the upper portion of gate electrode 1.

Figure 3D:
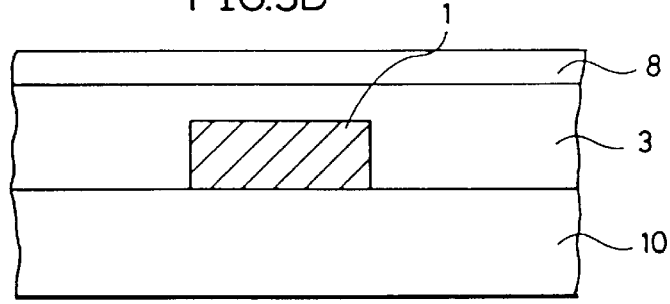

Then, as shown in FIG. 3D, a polysilicon layer 8 with a predetermined film thickness is formed on the surface of dielectric layer 3.

Subsequently, as shown in FIG. 3E, the thin film transistor shown in FIG. 1 is formed by the step similar to that of FIG. 2F.

Figure 15:
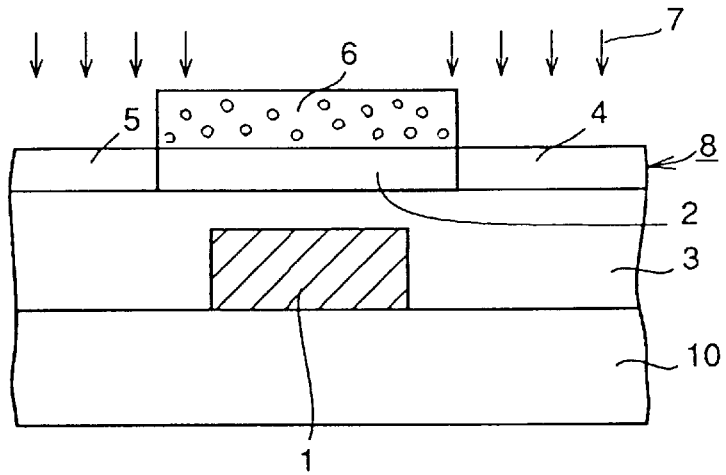
FIGS. 15, 18 and 21 are sectional diagrams showing a phase of manufacturing the thin film transistors shown in FIGS. 13, 16 and 19, respectively, with the process of manufacturing shown in FIGS. 3A–3E and at the phase corresponding to FIG. 3E.
Figure 18:
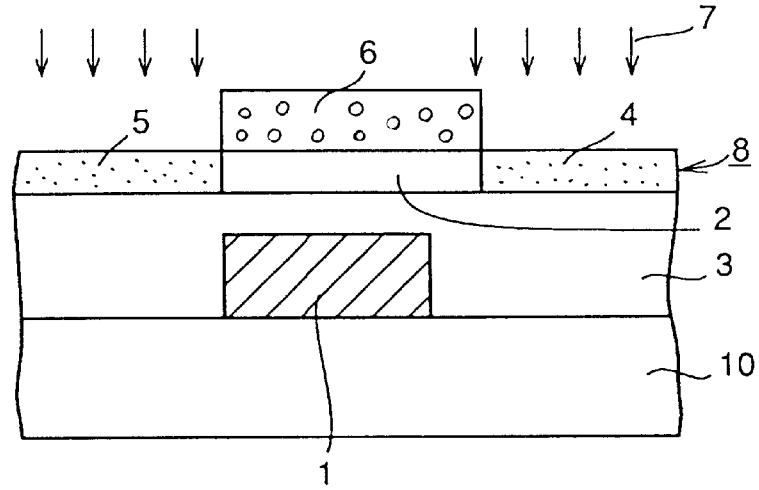
Figure 21:
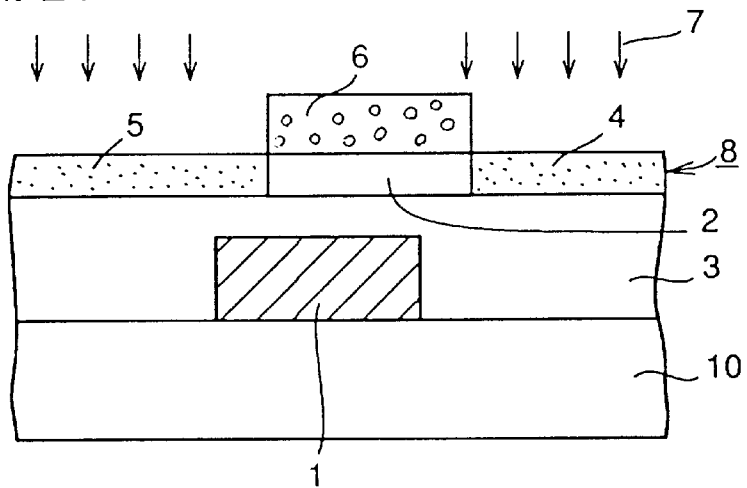

The process of manufacturing the thin film transistor shown in FIG. 1 and described with respect to FIGS. 3A to 3E can be used to manufacture the thin film transistors shown in FIGS. 13, 16 and 19, respectively. FIGS. 15, 18 and 21 show sectional structures of such thin film transistors and correspond to the phase of manufacture shown in FIG. 3E with corresponding portions having the same identification.

Furthermore, another embodiment of the present invention will be described. Referring to FIG. 4, a thin film transistor according to this example has two-layered structure as a dielectric layer including first dielectric layers 3a, 3a composed of sidewall insulating layers formed on sidewalls of a gate electrode 1, and a second dielectric layer 3b formed on surfaces of gate electrode 1 and sidewall insulating films 3a, 3a. In such a structure, the electric field concentration produced in regions of a dielectric layer located at corners of gate electrode 1 and side surfaces thereof can be moderated.

Figure 22:
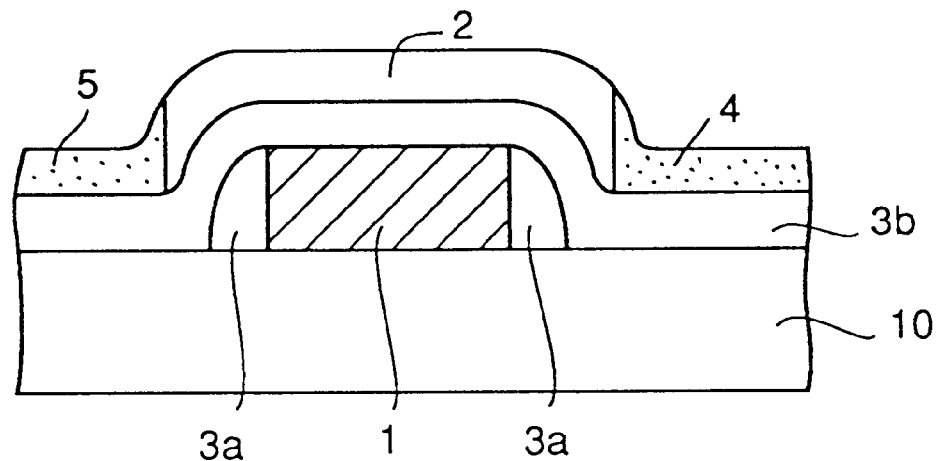
FIGS. 22, 24 and 26 are sectional structure diagrams of thin film transistors having the basic structures of FIGS. 10(2), 10(3) and 10(4), respectively, with sidewall insulating films formed on the gate electrodes, as shown in FIG. 4.
Figure 24:
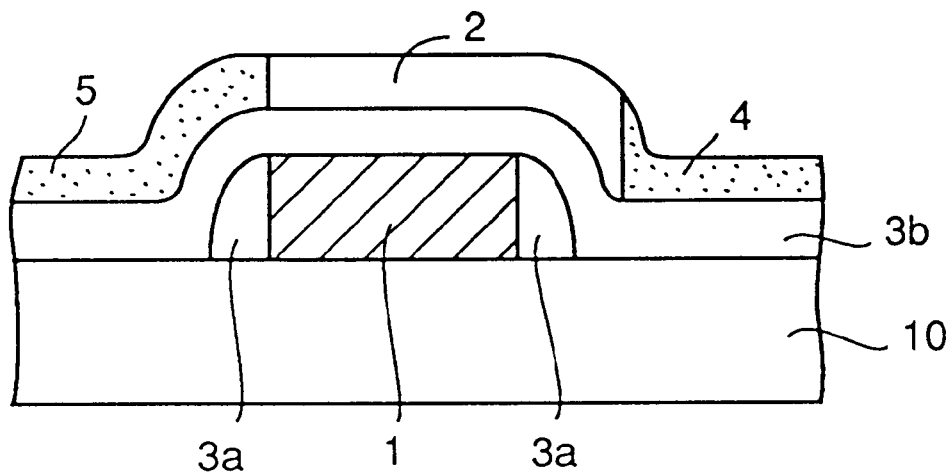
Figure 25:
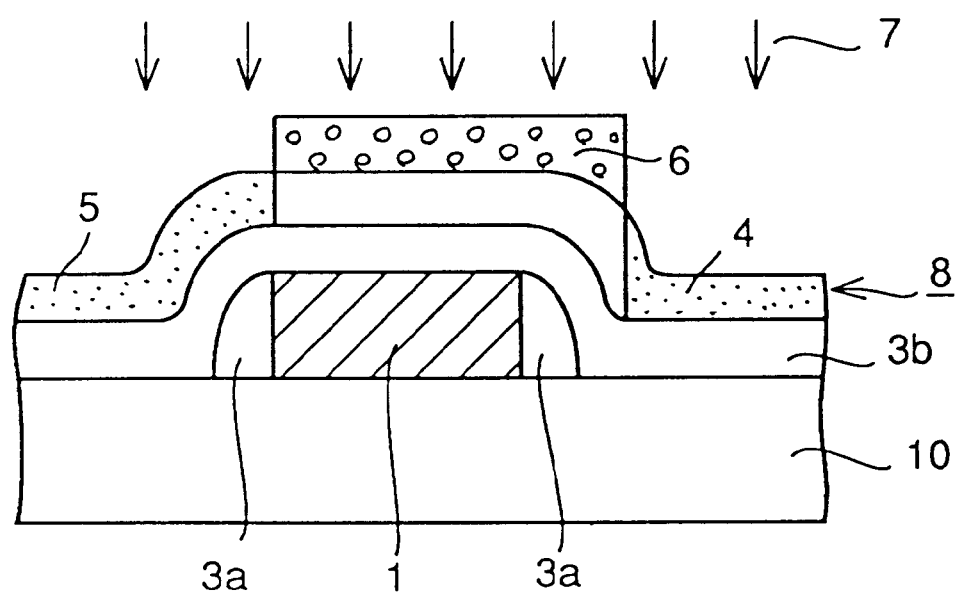
Figure 26:
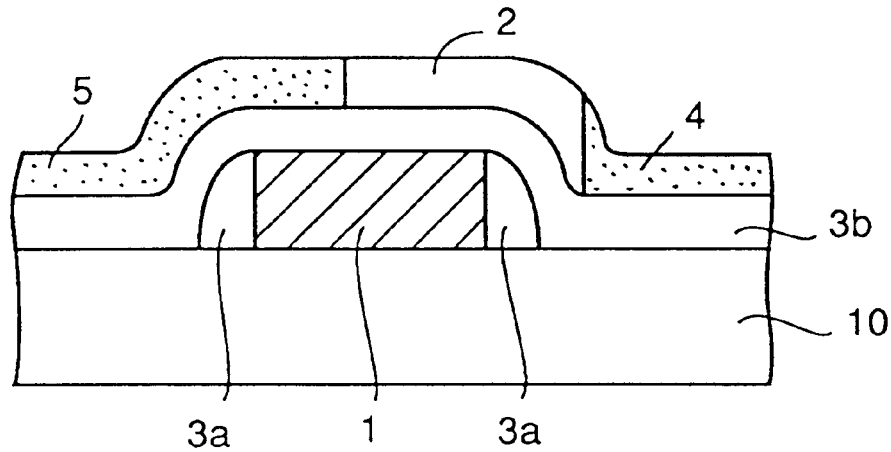

Similar structures to that of FIG. 4 can be provided for thin film transistors having the basic structures shown in FIGS. 10(2), 10(3) and 10(4). FIGS. 22, 24 and 26 show such similar structures of thin film transistors having the basic structures of FIGS. 10(2), 10(3) and 10(4) with sidewall insulating films formed on the gate electrodes. The sectional structures are similar to the sectional structure shown in FIG. 4 with corresponding portions having the same identification. The difference in each sectional structure is the position of the interfaces between the channel region and the source/drain regions with respect the gate electrode 1.

Next, the steps of manufacturing the thin film transistor shown in FIG. 4 will be described.

First, as shown in FIG. 5A, a gate electrode 1 is formed by an equivalent step to that described with respect to FIG. 2A.

Figure 5B:
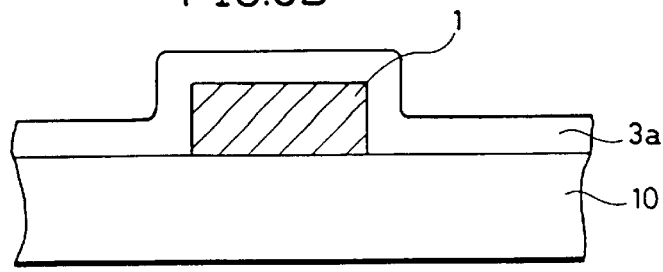

Next, as shown in FIG. 5B, a silicon oxide film 3a is deposited using the low pressure CVD method.

Figure 5C:
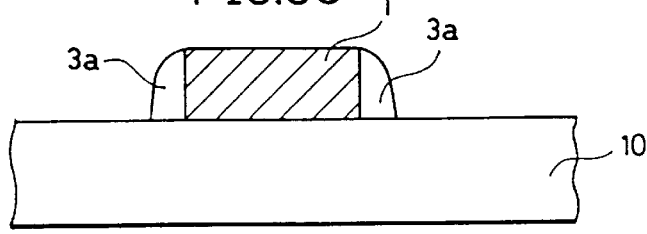

Furthermore, as shown in FIG. 5C, the silicon oxide films 3a, 3a are anisotropically etched. By this anisotropic etching, silicon oxide film 3a is etched and removed uniformly only in the direction of the film thickness. Accordingly, the first dielectric layers 3a, 3a formed of silicon oxide films are formed only on sidewalls of gate electrode 1.

Figure 5D:
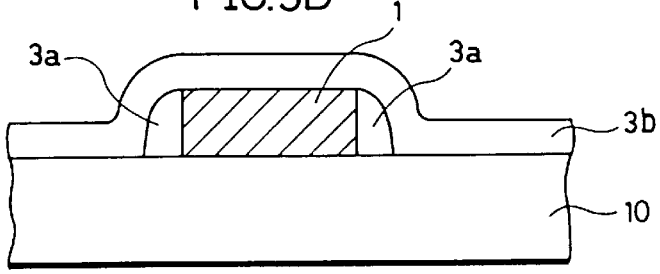

Furthermore, as shown in FIG. 5D, a silicon oxide film 3b is deposited with a predetermined film thickness using the low pressure CVD method all over the surface.

Figure 5E:
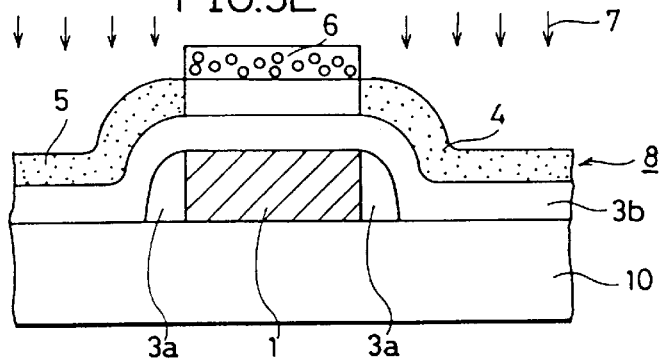
Figure 6:
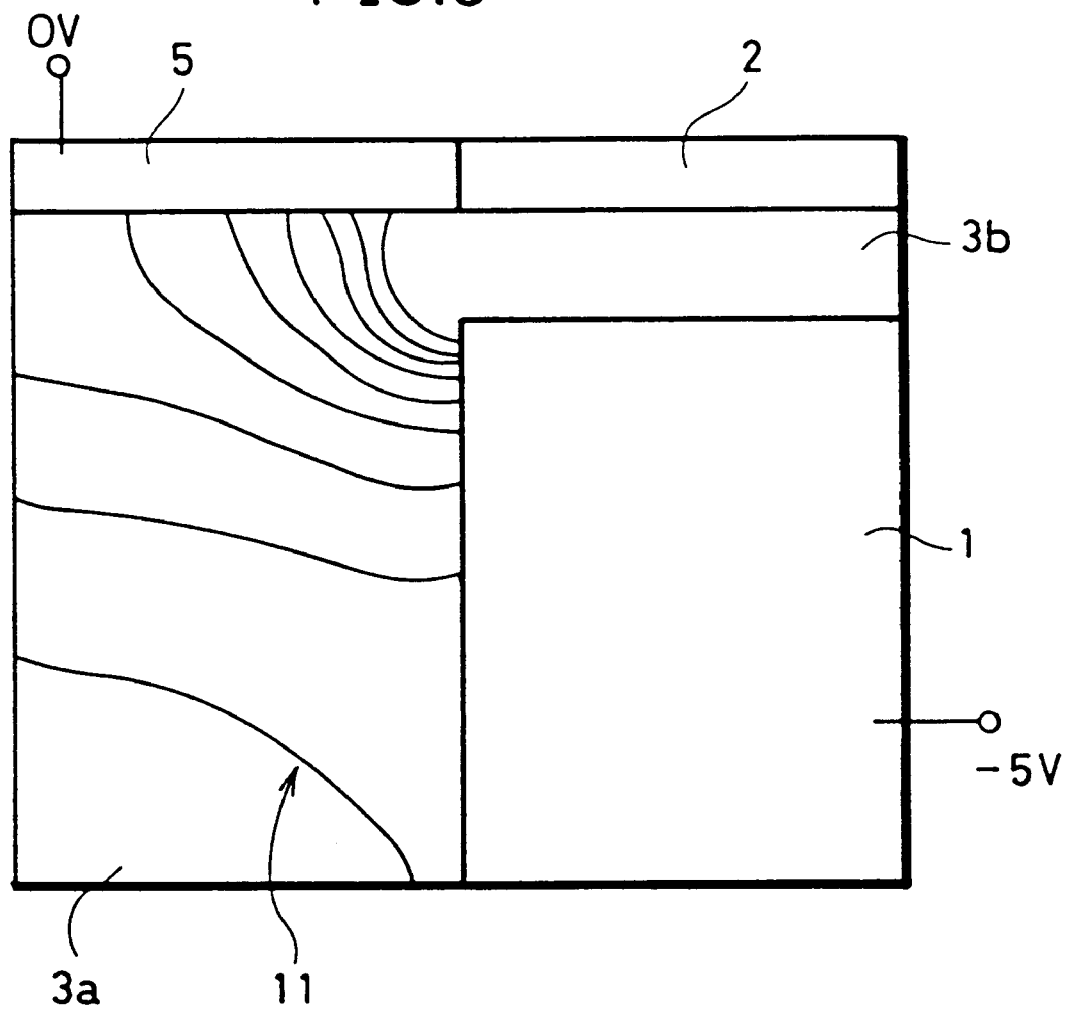
FIG. 6 is an electrical field strength distribution diagram showing the electric field strength distribution when the thin film transistor shown in FIG. 1 is operating.
Figure 7:
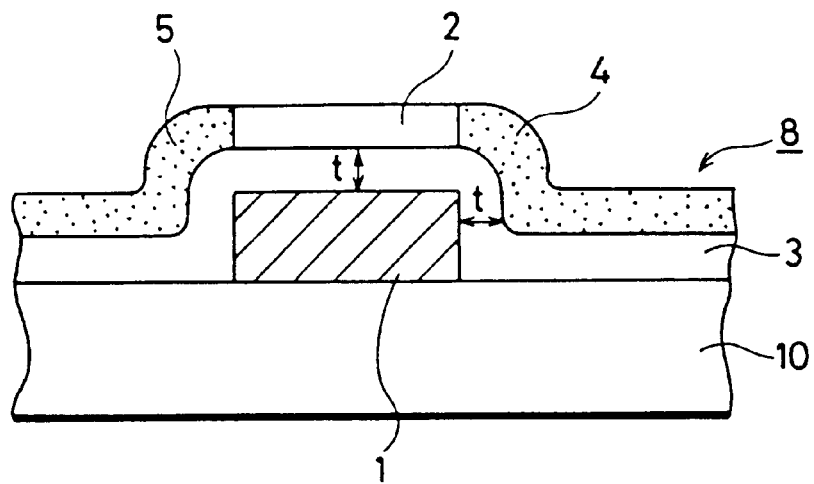
FIG. 7 is a sectional structure diagram of a conventional thin film transistor.

Subsequently, as shown in FIG. 5E, a polysilicon layer 8 is deposited on the surface of the second dielectric layer 3b using the low pressure CVD method. Furthermore, a resist pattern 6 is formed using the photolithography method on the surface of a region located over gate electrode 1 of polysilicon layer 8. Then, using the resist 6 as a mask, p-type impurity ions 7 are implanted into polysilicon layer 8 to form conductive regions 4, 5.

Figure 23:
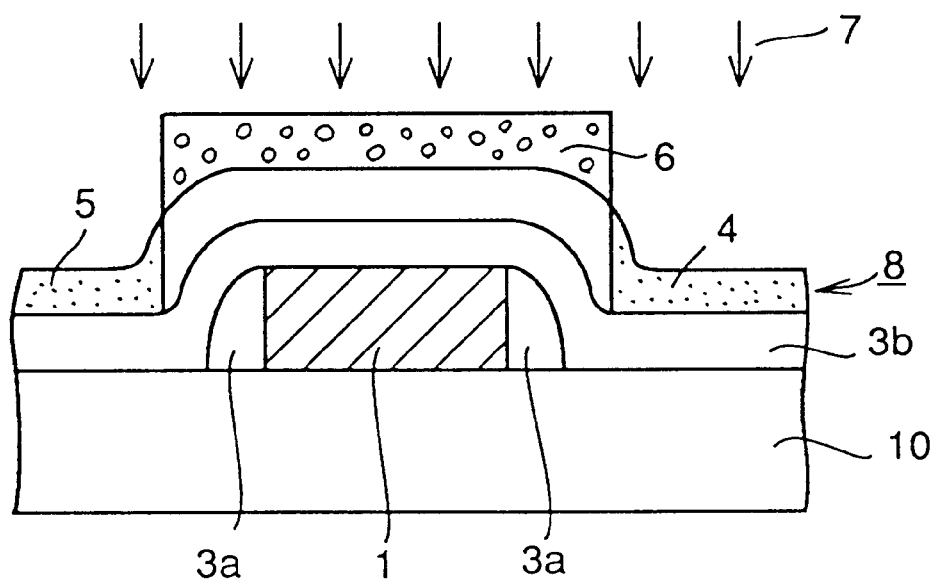
FIGS. 23, 25 and 27 are sectional diagrams showing a phase of manufacturing the thin film transistors with sidewall insulating films formed on the gate electrodes as shown in FIGS. 22, 24 and 26, respectively, with the process of manufacturing shown in FIGS. 5A–5E and at the phase corresponding to FIG. 5E.
Figure 27:
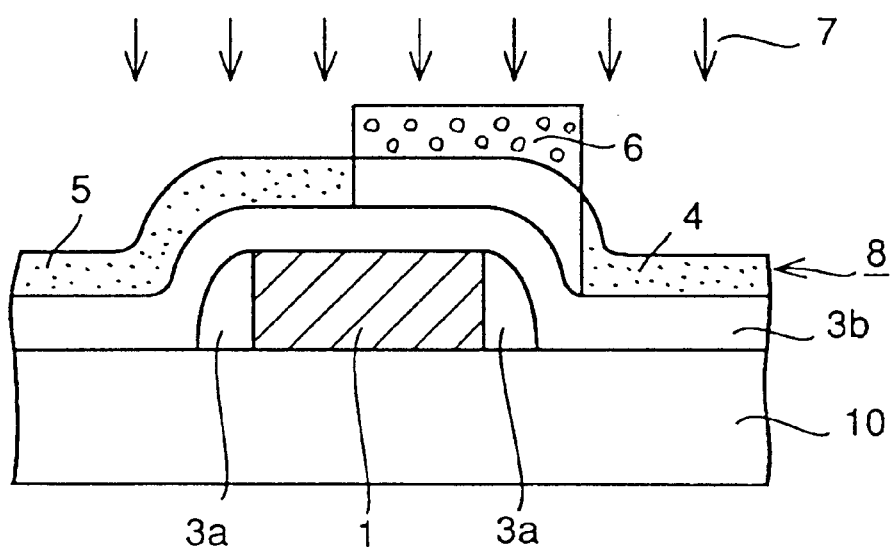

The steps of manufacturing the thin film transistor shown in FIG. 4 and described with respect to FIGS. 5A to 5E can be used to manufacture the thin film transistors shown in FIGS. 22, 24 and 26, respectively. FIGS. 23, 23 and 27 show sectional structures of such thin film transistors and correspond to the phase of manufacture shown in FIG. 5E with corresponding portions having the same identification.

Although, a p-channel transistor has been described in the above embodiments, it is not limited to the same and can be also applied to an n-channel transistor.

Furthermore, although an example in which channel region 2, source/drain region 4 are formed in polysilicon layer 8 has been described in the above, single crystalline silicon, amorphous silicon, or other semiconductor materials can be employed in place of the polysilicon layer. A single crystalline silicon is formed by the solid phase epitaxial growth method, for example. The amorphous silicon is formed by the CVD method or the spattering method, for example.

An example in which an oxide film is employed as a dielectric layer has been described, but other insulating films such as a nitride film or a multi-layered film thereof may be employed.

As described above, in a thin film transistor in accordance with the present invention, the surface of the dielectric layer covering a gate electrode is made flat, and a polysilicon layer having conductive regions is formed on the surface thereof, so that the electric field concentration is moderated in the vicinity of side portions and angular portions of the gate electrode to increase the life time of the transistor.

In another aspect, by implementing a 2-layered structure as a dielectric layer having sidewall insulating films and another insulating film covering the surfaces thereof, the electric field concentration can be moderated similarly to the above embodiment.

In a semiconductor device having a flat dielectric layer, the flat surface can be easily formed by combination of the etch back method and the thin film depositing method.

Furthermore, by forming sidewall insulating layers employing the anisotropic etching on sidewalls of a gate electrode, and covering the surfaces thereof with a second insulating layer, a thin film transistor with increased film thickness of a dielectric layer in the vicinity of a side portion of a gate electrode can be easily manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A single gate thin film transistor, comprising:
   a gate electrode formed on an insulating layer and having opposite sidewalls;
   a dielectric layer formed on said insulating layer and covering upper and side surfaces of said gate electrode, said dielectric layer overlying said gate electrode having a thickness t; and
   a polycrystalline silicon layer formed on an upper surface of said dielectric layer, said polycrystalline silicon layer having a channel region formed above said gate electrode and having a pair of impurity regions formed respectively at opposite sides of said channel region, said channel region having a length equal to or greater than the length of the gate electrode, and a shave of said channel region having no corners or edges conforming to a shape of the sidewalls of the gate electrode,
   an interface between said dielectric layer and said polycrystalline silicon layer lying in a single plane throughout a first region beneath said channel region and a second region extending beyond each said sidewall of said gate electrode by a distance greater than said thickness t of said dielectric layer, wherein
      said dielectric layer comprises a first insulating layer formed in contact with said side wall of said gate electrode and has a film thickness equal to that of said gate electrode and a second insulating layer has a flat surface formed on the surface of this first insulating layer.

2. The thin film transistor according to claim 1, wherein said dielectric layer comprises a TEOS film.

3. A single gate thin film transistor, comprising:
   a gate electrode formed on a first insulating layer and having an upper surface and opposite sidewalls;
   a dielectric layer, having a second insulating layer formed only on said first insulating layer in the vicinity of said gate electrode in contact with side surfaces of said gate electrode, and a third insulating layer formed on surfaces of said gate electrode, said first insulating layer and said second insulating layers; and
   a polysilicon layer formed on the surface of said dielectric layer having a channel region formed in a region located above said gate electrode and a pair of conductive regions formed in regions located on both sides of the channel region, said channel region having a length greater than the length of said gate electrode, and a shape of said channel region having no corners or edges conforming to a shape of the sidewalls of the gate electrode, wherein
   a distance between said sidewall of said gate electrode and an interface between said semiconductor and dielectric layers is greater than a distance between said upper surface of said gate electrode and said interface.

4. A single gate thin film transistor, comprising:
   a gate electrode having a thickness t1 formed on an insulating layer and having opposite sidewalls;
   a first dielectric layer having a thickness t2 formed on the insulating layer and on said opposite sidewalls;
   a second dielectric layer having a thickness t3 formed on the insulating layer, an upper surface of the first dielectric layer and an upper surface of said gate electrode;
   a polycrystalline silicon layer formed on the insulating layer, the gate electrode, the first dielectric layer and an upper surface of the second dielectric layer, said polycrystalline silicon layer having a channel region formed above the gate electrode and a pair of impurity regions formed respectively at opposite sides of said channel region, said channel region having a length equal to or greater than the length of said gate electrode, and a shape of said channel region having no corners or edges conforming to a shape of the sidewalls of the gate electrode; and
   an interface between said second dielectric layer and said polycrystalline silicon layer, wherein
      the first and second dielectric layers are different materials, and
      a distance from a corner and all portions of said opposite side walls of the gate electrode to any portion of said interface is greater than t3.

5. The thin film transistor according to claim 4, wherein t1 is equal to t2.

6. The thin film transistor according to claim 4, wherein the first dielectric layer is a TEOS film.

7. The thin film transistor according to claim 4, wherein said interface between said semiconductor layer and said second dielectric layer is planar for the entirety of the semiconductor layer.

8. A single gate thin film transistor, comprising:
   a gate electrode formed on an insulating layer and having opposite sidewalls;
   a dielectric layer formed on said insulating layer and covering upper and side surfaces of said gate electrode, said dielectric layer overlying said gate electrode having a thickness t; and
   a semiconductor layer formed on an upper surface of said dielectric layer, said semiconductor layer having a channel region formed above said gate electrode and having a pair of impurity regions formed respectively at opposite sides of said channel region, a shape of said channel region having no corners or edges conforming to a shape of the sidewalls of the gate electrode
   an interface between said dielectric and said semiconductor layer lying in a single plane throughout a first region beneath said channel region and a second region extending beyond each said sidewall of said gate electrode by a distance greater than said thickness t of said dielectric layer, wherein
      said dielectric layer comprises a first insulating layer formed in contact with the side walls of said gate electrode and having a film thickness equal to that of said gate electrode and a second insulating layer having a flat surface formed on the surface of this first insulating layer, said pair of impurity regions are source and drain regions, respectively, and the portion of the interface between the channel region and each impurity region in a channel length direction substantially coincides with opposing ends of the gate electrode in a channel length direction.

9. A single gate thin film transistor, comprising:

a gate electrode formed on a first insulating layer and having an upper surface and opposite sidewalls;

a dielectric layer, having a second insulating layer formed only on said first insulating layer in the vicinity of said gate electrode in contact with side surfaces of said gate electrode, and a third insulating layer formed on surfaces of said gate electrode, said first insulating layer and said second insulating layer, said second insulating layer having its width reduced upwardly; and a polysilicon layer formed on the surface of said dielectric layer having a channel region formed in a region located above said gate electrode and a pair of conductive regions formed in regions located on both sides of the channel region, a shape of said channel region having no corners or edges conforming to a shape of the sidewalls of the gate electrode, wherein a distance between said sidewall of said gate electrode and an interface between said semiconductor and dielectric layers is greater than a distance between said upper surface of said gate electrode and said interface, said pair of conductive regions are source and drain regions, respectively, and the portion of the interface between the channel region and each impurity region in a channel length direction substantially coincides with opposing ends of the gate electrode in a channel length direction.

10. A single gate thin film transistor, comprising:

a gate electrode formed on an insulating layer and having opposite sidewalls;

a dielectric layer formed on said insulating layer and covering upper and side surfaces of said gate electrode, said dielectric layer overlying said gate electrode having a thickness t; and a semiconductor layer formed on an upper surface of said dielectric layer, said semiconductor layer having a channel region formed above said gate electrode and having a pair of impurity regions formed respectively at opposite sides of said channel region, a shape of said channel region having no corners or edges conforming to a share of the sidewalls of the gate electrode, an interface between said dielectric and said semiconductor layer lying in a single plane throughout a first region beneath said channel region and a second region extending beyond each said sidewall of said gate electrode by a distance greater than said thickness t of said dielectric layer, wherein said dielectric layer comprises a first insulating layer formed in contact with the side walls of said gate electrode and having a film thickness equal to that of said gate electrode and a second insulating layer having a flat surface formed on the surface of this first insulating layer, said pair of impurity regions are source and drain regions, respectively, and the portion of the interface between the channel region and the drain region in a channel length direction is positioned outside an end of the gate electrode on its drain side in a channel length direction and the portion of the interface between the channel region and the source region in a channel length direction is positioned outside an end of the gate electrode on its source side in a channel length direction.

11. A single gate thin film transistor, comprising:

a gate electrode formed on an insulating layer and having opposite sidewalls;

a dielectric layer formed on said insulating layer and covering upper and side surfaces of said gate electrode, said dielectric layer overlying said gate electrode having a thickness t; and a semiconductor layer formed on an upper surface of said dielectric layer, said semiconductor layer having a channel region formed above said gate electrode and having a pair of impurity regions formed respectively at opposite sides of said channel region, a shape of said channel region having no corners or edges conforming to a shape of the sidewalls of the gate electrode, an interface between said dielectric and said semiconductor layer lying in a single plane throughout a first region beneath said channel region and a second region extending beyond each said sidewall of said gate electrode by a distance greater than said thickness t of said dielectric layer, wherein said dielectric layer comprises a first insulating layer formed in contact with the side walls of said gate electrode and having a film thickness equal to that of said gate electrode and a second insulating layer having a flat surface formed on the surface of this first insulating layer, said pair of impurity regions are source and drain regions, respectively, and the portion of the interface between the channel region and the source region in a channel length direction substantially coincides with an end of the gate electrode on its source side in the channel length direction, and the portion of the interface between the channel region and the drain region in a channel length direction is positioned outside an end of the gate electrode on its drain side in the channel length direction.

12. A single gate thin film transistor, comprising:

a gate electrode formed on an insulating layer and having opposite sidewalls;

a dielectric layer formed on said insulating layer and covering upper and side surfaces of said gate electrode, said dielectric layer overlying said gate electrode having a thickness t; and a semiconductor layer formed on an upper surface of said dielectric layer, said semiconductor layer having a channel region formed above said gate electrode and having a pair of impurity regions formed respectively at opposite sides of said channel region, a shape of said channel region having no corners or edges conforming to a shape of the sidewalls of the gate electrode, an interface between said dielectric and said semiconductor layer lying in a single plane throughout a first region beneath said channel region and a second region extending beyond each said sidewall of said gate electrode by a distance greater than said thickness t of said dielectric layer, wherein said dielectric layer comprises a first insulating layer formed in contact with the side walls of said gate electrode and having a film thickness equal to that of said gate electrode and a second insulating layer having a flat surface formed on the surface of this first insulating layer, said pair of impurity regions are source and drain regions, respectively, and the portion of the interface between the channel region and the source region in a channel length direction is positioned inside and end of the gate electrode on its source side in the channel length direction, and the portion of the interface between the channel region and the drain region in a channel length direction is positioned outside an end of the gate electrode on its drain side in the channel length direction.

13. A single gate thin film transistor, comprising:

a gate electrode formed on a first insulating layer and having an upper surface and opposite sidewalls;

a dielectric layer, having a second insulating layer formed only on said first insulating layer in the vicinity of said gate electrode in contact with side surfaces of said gate electrode, and a third insulating layer formed on surfaces of said gate electrode, said first insulating layer and said second insulating layer, said second insulating layer having its width reduced upwardly; and a polysilicon layer formed on the surface of said dielectric layer having a channel region formed in a region located above said gate electrode and a pair of conductive regions formed in regions located on both sides of the channel region, a shape of said channel region having no corners or edges conforming to a shape of the sidewalls of the gate electrode, wherein a distance between said sidewall of said gate electrode and an interface between said semiconductor and dielectric layers is greater than a distance between said upper surface of said gate electrode and said interface, said pair of conductive regions are source and drain regions, respectively, and the portion of the interface between the channel region and the drain region in a channel length direction is positioned outside an end of the gate electrode on its drain side in a channel length direction and the portion of the interface between the channel region and the source region in a channel length direction is positioned outside an end of the gate electrode on its source side in a channel length direction.

14. A single gate thin film transistor, comprising:

a gate electrode formed on a first insulating layer and having an upper surface and opposite sidewalls;

a dielectric layer, having a second insulating layer formed only on said first insulating layer in the vicinity of said gate electrode in contact with side surfaces of said gate electrode, and a third insulating layer formed on surfaces of said gate electrode, said first insulating layer and said second insulating layer, said second insulating layer having its width reduced upwardly; and a polysilicon layer formed on the surface of said dielectric layer having a channel region formed in a region located above said gate electrode and a pair of conductive regions formed in regions located on both sides of the channel region, a shape of said channel region having no corners or edges conforming to a shape of the sidewalls of the gate electrode, wherein a distance between said sidewall of said gate electrode and an interface between said semiconductor and dielectric layers is greater than a distance between said upper surface of said gate electrode and said interface, said pair of conductive regions are source and drain regions, respectively, and the portion of the interface between the channel region and the source region in a channel length direction substantially coincides with an end of the gate electrode on its source side in the channel length direction, and the portion of the interface between the channel region and the drain region in a channel length direction is positioned outside an end of the gate electrode on its drain side in the channel length direction.

15. A single gate thin film transistor, comprising:

a gate electrode formed on a first insulating layer and having an upper surface and opposite sidewalls;

a dielectric layer, having a second insulating layer formed only on said first insulating layer in the vicinity of said gate electrode in contact with side surfaces of said gate electrode, and a third insulating layer formed on surfaces of said gate electrode, said first insulating layer and said second insulating layer, said second insulating layer having its width reduced upwardly; and a polysilicon layer formed on the surface of said dielectric layer having a channel region formed in a region located above said gate electrode and a pair of conductive regions formed in regions located on both sides of the channel region, a shape of said channel region having no corners or edges conforming to a shape of the sidewalls of the gate electrode, wherein a distance between said sidewall of said gate electrode and an interface between said semiconductor and dielectric layers is greater than a distance between said upper surface of said gate electrode and said interface, said pair of conductive regions are source and drain regions, respectively, and the portion of the interface between the channel region and the source region in a channel length direction is positioned inside and end of the gate electrode on its source side in the channel length direction, and the portion of the interface between the channel region and the drain region in a channel length direction is positioned outside an end of the gate electrode on its drain side in the channel length direction.

* * * * *